United States Patent [19]
Kramer et al.

[11] Patent Number: 5,880,993
[45] Date of Patent: Mar. 9, 1999

[54] METHOD AND CIRCUIT FOR CHECKING MULTILEVEL PROGRAMMING OF FLOATING-GATE NONVOLATILE MEMORY CELLS PARTICULARLY FLASH CELLS

[75] Inventors: Alan Kramer, Berkeley, Calif.; Roberto Canegallo, Tortona, Italy; Mauro Chinosi, Cologno Monzese, Italy; Giovanni Gozzini, Palazzolo sull'Oglio, Italy; Pier Luigi Rolandi, Volpedo, Italy; Marco Sabatini, Brescia, Italy

[73] Assignee: SGS-Thomson Microelectronics, S.r.l., Agrate Brianza, Italy

[21] Appl. No.: 941,882

[22] Filed: Sep. 30, 1997

[30] Foreign Application Priority Data

Sep. 30, 1996 [EP] European Pat. Off. .............. 96830496
Dec. 5, 1996 [EP] European Pat. Off. .............. 96830612

[51] Int. Cl.$^6$ .................................................. G11C 16/06
[52] U.S. Cl. ............................... 365/185.22; 365/185.03; 365/185.33; 365/185.19
[58] Field of Search ........................ 365/185.22, 185.03, 365/185.33, 185.19

[56] References Cited

U.S. PATENT DOCUMENTS

| | | | |
|---|---|---|---|
| 4,758,749 | 7/1988 | Rapp . | |
| 5,684,741 | 11/1997 | Talreja | 365/185.22 |
| 5,699,296 | 12/1997 | Song | 365/185.22 |

FOREIGN PATENT DOCUMENTS

| | | |
|---|---|---|
| 0718850 A1 | 6/1996 | European Pat. Off. . |
| WO 92/02934 | 2/1992 | WIPO . |

OTHER PUBLICATIONS

M. Bauer et al., "A Multilevel–Cell 32 MB Flash Memory", *IEEE International Solid–State Circuits Conference*, Session 7, Flash Memory, Paper TA 7.7; pp. 98–99, 132–133; Feb. 16, 1995.

Kyu–hyoun Kim and Kwyro Lee, "A True Nonvolatile Analog Memory Cell Using Coupling–Charge Balancing," *1996 IEEE International Solid–State Circuits Conference*, Session 16, Technology Directions: Memory, Paper FP 16.5; pp. 218–219, 268–269; Feb. 9, 1996.

Hieu Van Tran et al., "A 2.5V 256–Level Non–Volatile Analog Storage Device Using EEPROM Technology," *1996 IEEE International Solid–State Circuits Conference*, Session 16, Technology Directions: Memory, Paper FP 16.6; pp. 220–221, 270–271; Feb. 9, 1996.

Chris Diorio et al., "A High–Resolution Non–Volatile Analog Memory Cell," *1995 IEEE International Symposium on Circuits and Systems*, Apr. 1995.

Douglas A. Mercer, "A 14–b 2.5 MSPS Pipelined ADC with On–Chip EPROM," *IEEE Journal of Solid–State Circuits 31(1)*:70–76, Jan. 1996.

*Primary Examiner*—David Nelms
*Assistant Examiner*—Andrew Q. Tran
*Attorney, Agent, or Firm*—David V. Carlson; Frederick M. Fliegel; Seed and Berry LLP

[57] ABSTRACT

To check the programming of a nonvolatile memory cell storing an actual threshold value, the drain terminal of the cell is biased at a constant voltage; the gate terminal is biased at a check voltage; the cell is supplied with a predetermined current to determine a gate-source voltage drop related to the actual threshold value; and the voltage at the source terminal is supplied to an input of an operational amplifier. In an open-loop configuration, the desired threshold value of the set predetermined current is supplied as the check voltage; the amplifier compares the source voltage with the ground; and switching of the amplifier indicates the desired threshold value has been reached. In a closed-loop configuration, the output of the operational amplifier is connected directly to the gate terminal of the cell, and supplies the desired threshold value directly.

17 Claims, 2 Drawing Sheets

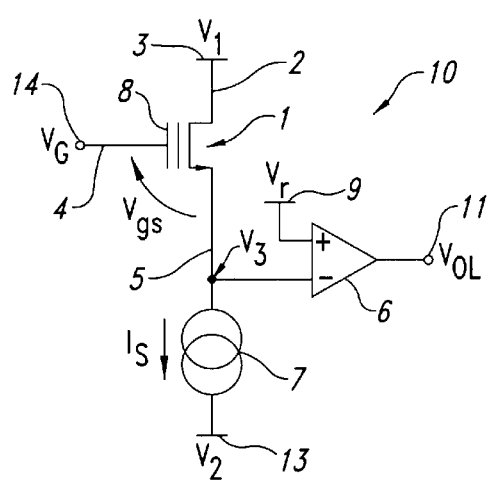
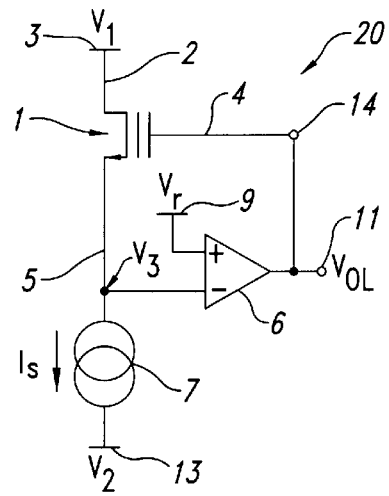
Fig. 1
Fig. 2
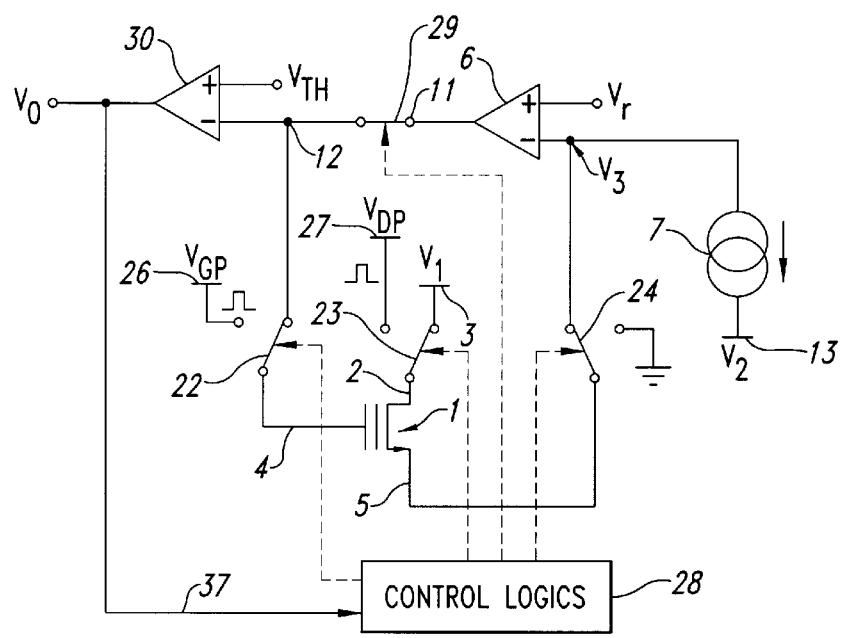
Fig. 3

METHOD AND CIRCUIT FOR CHECKING MULTILEVEL PROGRAMMING OF FLOATING-GATE NONVOLATILE MEMORY CELLS PARTICULARLY FLASH CELLS

TECHNICAL FIELD

The present invention relates to a method and circuit for checking multilevel programming of floating-gate nonvolatile memory cells, particularly flash cells.

BACKGROUND OF THE INVENTION

As is known, for performing complex processing functions, analog memories are currently being studied, the cells of which are capable of memorizing a number of multibit analog or digital values. For this purpose, use is advantageously made of flash cells, in which the value to be memorized is related to the threshold voltage of the cell.

To memorize the input values, such memories employ a programming stage including a programming circuit for modifying the amount of electric charge stored in the floating gate of each cell, and a check circuit for determining whether the desired threshold value has been reached. For this purpose, various programming procedures are known employing as variables the gate and drain voltages of the cells and programming time, according to solutions employing empirical relations or iterative processes. In the first case, a single programming pulse of a predetermined value and duration is normally supplied, and a check is subsequently made to determine whether the threshold value so programmed corresponds with the desired value. In the second case, a number of programming pulses are supplied, and, after each pulse, a check is made to determine whether the desired threshold has been reached, in which case the programming procedure is interrupted.

Currently used read and programming check circuits employ various solutions based on measuring the injected charge or on comparison with a reference voltage, but none has proved entirely satisfactory owing to the need for specially structured memory cells, or the complex design of the circuit, or the duration of the check operations, which is especially disadvantageous in the case of a large number of cells. Nor are known circuits always capable of memorizing any analog value or a large number of different levels.

What is needed is to provide a method and circuit permitting multilevel programming of nonvolatile memory cells by means of a fully and easily integratable structure, which provide for reducing programming time even in the case of a large number of cells.

SUMMARY OF THE INVENTION

According to the present invention, there are provided a method and circuit for checking multilevel programming of nonvolatile memory cells.

In practice, according to an embodiment of the invention, the gate-source or gate-drain voltage drop is regulated automatically so that a set current flows in the nonvolatile memory cell. The voltage drop in the cell is related to the stored threshold value, and may therefore be compared directly or indirectly with the desired value to determine the programming state of the cell. In a first embodiment, an operational amplifier may be used in a closed-loop configuration to directly read the stored threshold value. This configuration allows the cell to be programmed to a relatively precise stored threshold value, but at the expense of programming rapidity.

In a second embodiment, an open-loop operational amplifier is used as a comparator to determine when a desired threshold value has been programmed into the cell. This embodiment is more rapid, but results in less precision in the actual programmed threshold value.

In a third embodiment, either the first or the second embodiment may be selected via programmable switches coupled to the operational amplifier and the cells. This permits a single integrated circuit employing this embodiment to switch between the programming modes of the first and second embodiments.

BRIEF DESCRIPTION OF THE DRAWINGS

A number of preferred, non-limiting embodiments of the present invention will be described by way of example with reference to the accompanying drawings, in which:

FIG. 1 is a simplified schematic diagram of a first embodiment of the circuit according to the present invention.

FIG. 2 is a simplified schematic diagram of a second embodiment of the circuit according to the present invention.

FIG. 3 shows the circuit of FIG. 2 integrated with a cell programming device.

DETAILED DESCRIPTION OF THE INVENTION

Figure 4:
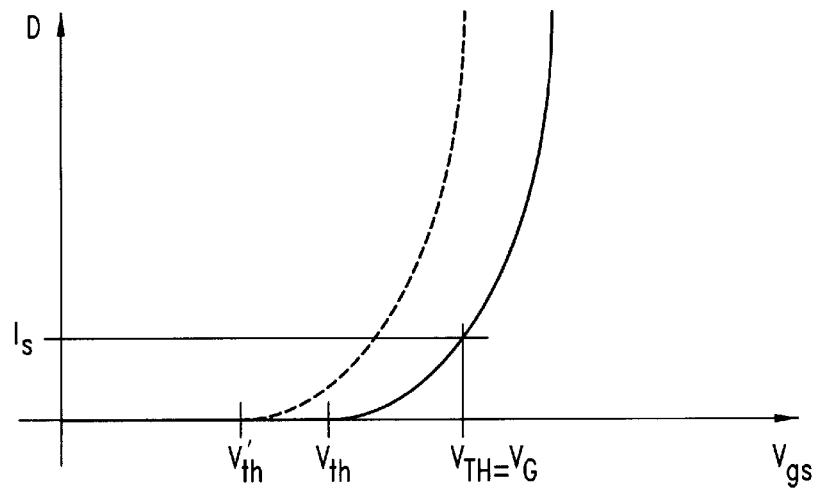
FIG. 4 is a graph showing two characteristics of flash cells.

FIG. 1 is a simplified schematic diagram showing a first, open-loop embodiment of circuit 10 according to the present invention. In the circuit of FIG. 1, indicated as a whole by 10, a nonvolatile memory cell 1 in this case, a flash cell—has the drain terminal 2 coupled to a reference line 3 at voltage $V_1$; the gate terminal 4 coupled to a node 14 at which is present a voltage $V_G$ equal to the desired programming voltage of cell 1; and the source terminal 5 is coupled to the inverting input of an operational amplifier 6 and to one terminal of a current source 7. The floating-gate region 8 of the cell 7 stores an electric charge determining an actual threshold voltage of the cell 1. Operational amplifier 6 has the noninverting input coupled to a reference line 9 at voltage $V_r$, and an output 11 supplying voltage $V_{OL}$. The output $V_{OL}$ will be a digital signal, high or low, depending on whether the signal $V_r$ is higher than $V_3$ or lower. The current source 7, generating current $I_S$, has the second terminal coupled to a reference line 13 at voltage $V_2$ lower than $V_r$. For example, if voltage $V_r$ is 0 (ground line), voltage $V_2$ is negative, typically −250 mV.

Circuit 10 (FIG. 1) operates as follows. Let it be assumed, for the sake of simplicity, that reference line 9 is the ground line. The threshold $V_{TH}$ of cell 1 is defined as the gate voltage (measured with respect to ground) causing the current $I_S$ set by current source 7 to be conducted through cell 1.

The drain current $I_D$ conducted through cells of the type considered is approximately given by the equation:

$$I_D = K(V_{gs} - V_{th})^2 \qquad (1)$$

where K is a constant depending on the fabrication process, $V_{gs}$ is the gate-source voltage drop and $V_{th}$ is the threshold voltage at which the cell starts conducting (at theoretically zero current)—see the continuous-line curve in FIG. 4. Since the current $I_D$ in the cell must equal the current $I_S$ set by source 7 ($I_D=I_S$), the overdrive $V_{gs}-V_{th}$ of the cell 1, in circuit 10, is set and substantially constant alongside variations in threshold voltage $V_{th}$ (which is gradually modified by programming).

Moreover, the gate voltage being fixed, $V_G=V_{TH}$, and if $V_3$ is the voltage with respect to ground of source terminal 5 of the cell 1, equation (1) becomes:

$$I_S=K(V_G-V_3-V_{th})^2 \qquad (1')$$

Consequently, if the threshold $V_{th'}$ stored in cell 1 is less than the $V_{th}$ value (at zero current) corresponding to the desired threshold $V_{th}$ and supplied at the gate terminal of cell 1 (see the dotted-line curve in FIG. 4), the voltage drop $V_{gs}$ must be reduced to ensure a constant set current (and hence a substantially constant overdrive). Since the gate voltage $V_G$ is imposed, voltage $V_3$ must therefore be increased to a positive value with respective to ground, in which case, the output voltage $V_{OL}$ of amplifier 6, operating as a comparator, is zero.

Conversely, if the threshold voltage $V_{th'}$ stored in cell 1 is greater than the zero-current value corresponding to the desired threshold $V_{TH'}$ voltage $V_3$ is brought to a negative value with respect to ground, and the output voltage $V_{OL}$ of the comparator is brought to a positive value.

In other words, the comparison of the source voltage $V_3$ and the reference voltage $V_r$ (ground) made by circuit 10 is equivalent to comparing the gate-source voltage drop $V_{gs}$ and the desired threshold voltage $V_{TH}$.

This comparison may be used, during programming, to determine when the cell 1 reaches the desired threshold value. That is, as programming proceeds, commencing from a situation in which cell 1 is not or is only slightly programmed (in which its memorized threshold voltage is less than that corresponding to the desired threshold), it is possible to determine the instant in which amplifier 6 switches, and which corresponds to zero crossover of source voltage $V_3$, i.e., to the desired threshold being reached. More specifically, by programming cell 1 by use of programming pulses (as explained in detail later on with reference to FIG. 3), and by checking, after each pulse, whether the desired threshold has been reached, programming may be interrupted on detecting switching of the amplifier 6, thus ensuring correct programming of the cell 1.

The circuit of FIG. 1 provides a digital output check signal. If the output at node 11 is high, the circuit is programmed correctly; if the output is low, further programming pulses are needed.

The cell 1 may then be read by biasing it in the same way as in check mode (drain voltage equal to $V_1$, source voltage equal to $V_r$, and current equal to $I_s$).

The accuracy of the circuit 10 depends on the resolving power of the comparator (in turn dependent on the gain of the comparator) and on the jump in the threshold following each programming pulse. Depending on the transients of the lines to which the cells are coupled, the read time of circuit 10 depends on the size of the memory and on the speed of the amplifier 6.

FIG. 2 is a simplified schematic diagram showing a second, closedloop embodiment as circuit 20 in which cell 1 again has the drain terminal 2 biased at voltage $V_1$, and the source terminal coupled to one terminal of current source 7 and to the inverting input of operational amplifier 6. In this case, however, instead of being set externally, the gate voltage of cell 1 is supplied by the output 11 of the operational amplifier 6. The node 11 has an analog voltage $V_{CL}$ thereon as the output of amplifier 6 during the programming. The circuit 20 is similar to that of the circuit 10, i.e., the noninverting input of amplifier 6 is biased at voltage $V_r$, typically grounded but may be to another voltage, and the second terminal of current source 7 is biased at a negative voltage with respect to $V_r$, e.g., −250 mV.

In circuit 20, when $V_r=0V$, the output voltage of the operational amplifier 6, equal to the gate voltage value of cell 1 with respect to ground, equals threshold voltage $V_{th}$ plus the overdrive voltage $V_{OV}$ needed to ensure that the cell 1 conducts the set current $I_S$ (i.e., equals the threshold reached at the set current) and equals voltage drop $V_{gs}$. That is, as in circuit 10 (FIG. 1), current source 7, by setting the current $I_S$ in the cell 1, fixes the overdrive voltage $V_{OV}$ of the cell 2. Since the threshold voltage is determined by the programming level reached, the value of $V_{gs}$ is therefore determined. And since, in a condition of equilibrium, the source voltage $V_3$ is zero (as imposed by the closed-loop connection of operational amplifier 6), the gate voltage $V_{CL}$ supplied at the output 11 of operational amplifier 6 equals $V_{gs}$. Since:

$$V_{OV}=V_{gs}-V_{th}$$

it follows that:

$$V_{CL}=V_{OV}+V_{th}.$$

Consequently, the output voltage reading on node 11 of circuit 20 gives a direct analog indication of the programming level reached, which may be compared by a comparator with the desired value to determine whether to continue the programming procedure. The circuit configuration 20 provides an analog output check signal.

The accuracy of circuit 20 (FIG. 2) depends on the loop gain of the circuit 20, and read time depends on the speed of the circuit 20 and on the size of the array, so that extremely fast read, and hence programming times, may be achieved by appropriately sizing the amplifier 6 according to the number of cells 1 in the memory array to be programmed. Generally speaking, circuit 20 is more accurate than circuit 10, but at the expense of a reduction in speed. Circuit 20 also supplies more information (by directly indicating the programming level reached, instead of simply indicating crossover or not of the set value).

A schematic diagram of a programming device employing circuit 20 (i.e., the closed-loop configuration) is shown by way of example in FIG. 3, which shows three two-position switches 22, 23 and 24. More specifically, switch 22 couples gate terminal 4 of cell 1, in a first position, to output 11 of circuit 20 via node 12 and switch 29 and, in a second position, to a first programming line 26 at a programming voltage $V_{GP}$. Switch 23 couples drain terminal 2, in a first position, to line 3 and, in a second position, to a second programming line 27 at $V_{DP}$. Switch 24 couples the source terminal, in a first position, to the inverting input of amplifier 6 and, in a second position, to ground. The control terminals of switches 22–24 (shown only schematically in FIG. 3) are controlled by a control logic circuit 28.

In the arrangement of FIG. 3, a switch 29 is interposed between the output 11 of operational amplifier 6 and node 12, and a comparator 30 has a first input coupled to node 12, a second input receiving the desired threshold voltage $V_{TH}$ of cell 1, and an output supplying a voltage $V_o$ to control logic circuit 28.

Control logic circuit 28 therefore controls the programming procedure and, more specifically, determines the duration of the programming pulses by controlling the positions of switches 22–24, and determines when programming is to be interrupted. More specifically, to program cell 1, control logic circuit 28 couples the gate, drain and source terminals of cell 1 respectively to line 26, line 27 and ground for a predetermined time interval, and then switches to connect switches 22–24 to nodes 12, $V_1$, and $V_3$, respectively, and closes switch 29 to permit comparator 30 to read the threshold voltage reached by cell 1. This is the switch position state shown in FIG. 3. The circuit of FIG. 3 thus has the distinct advantage that by simply changing the positions of the appropriate switches, the cell 1 can be programmed in the open-loop configuration or the closed loop configuration. If the threshold voltage reached is equal to or greater than the desired value $V_{TH}$, the output comparator 30 changes state and this signal is received on line 37 by control logic circuit 28. The control logic 28 thus terminates the programming procedure when the proper signal level has been programmed. Conversely, if the value $V_{th}$ has not been reached, then control logic circuit 28 switches the switches 22–24 and 29 to the programming position to perform another programming step.

The programming configuration of the circuit 10 of FIG. 1 may be obtained by the programming circuit of FIG. 3 operating using different switch positions. During programming, the desired voltage $V_{TH}$ is supplied on line 26 to switch 22 in the first position, switch 29 is open, and the output of amplifier 6 is switched to provide the input on line 27 to control logic circuit 28 to provide the signal to determine whether or not programming is to be continued.

In the case of a memory array comprising a number of cells similar to cell 1, one programming check circuit 10 or 20 may be provided for the whole array, and attainment of the threshold may be determined sequentially for all the cells.

The above programming check circuits 10 or 20 may also be used for standard NOR-coupled flash cells, though, in this case, reading is may be slow. That is, since the source terminals of all the cells forming part of the same memory sector are coupled to one another, the source capacitance of the cell being checked is high and this may reduce reading speed due to the source node of the cell being checked being coupled to the virtual ground of operational amplifier 6.

Figure 5:
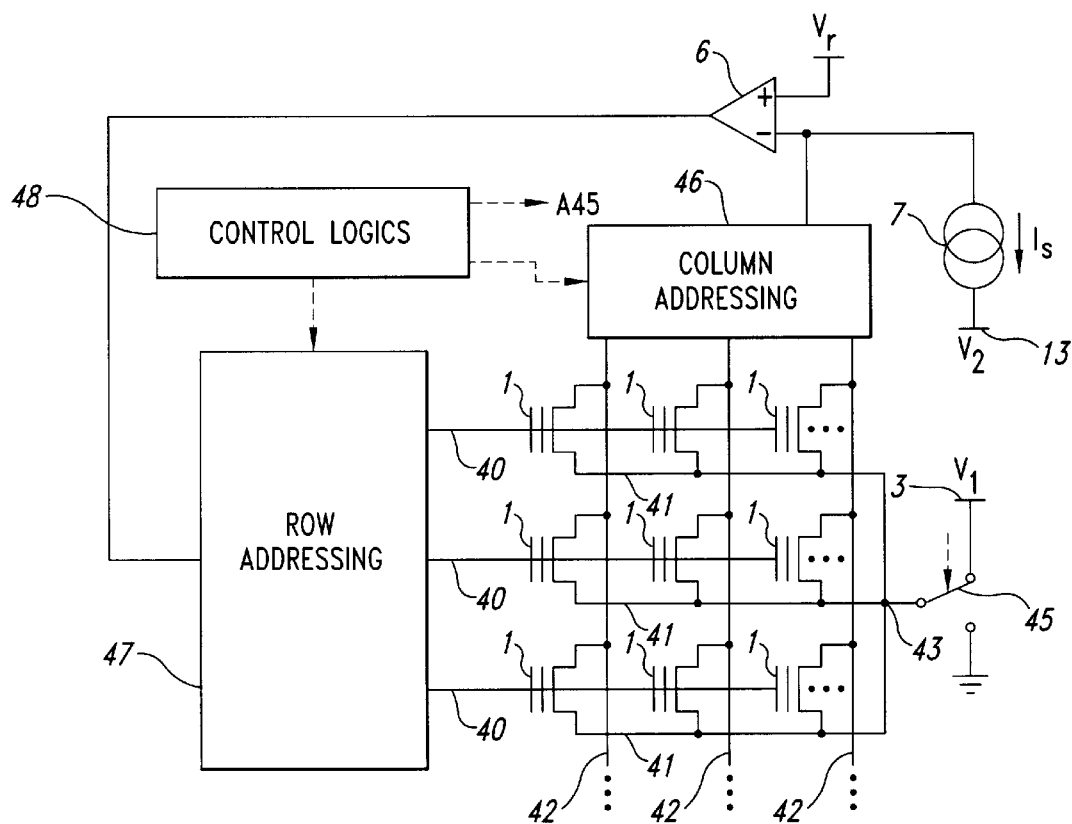
FIG. 5 is a simplified schematic diagram of a third embodiment of the circuit according to the present invention.

As such, it is advisable to invert the connection of the check circuit and the drain and source terminals of the cell 1 being checked, as shown in FIG. 5, in which the programming circuitry (similar to that of FIG. 3) is not shown for the sake of simplicity. FIG. 5 is a simplified schematic diagram of a portion (sector) of a memory array comprising a number of cells 1 arranged in rows and columns, with the cells 1 in the same row being coupled to the same word line 40 and to the same source line 41, the cells in the same column being coupled to the same bit line 42, and all the source lines 41 being coupled to one another at a source node 43. Source node 43 is coupled to an at least two-position switch 45 for selectively coupling source node 43 to reference line 3—now at voltage $V_r$—or to ground. Switch 45 is controlled by a control logic circuit 48 similar to control logic circuit 28 in FIG. 3, for controlling the programming operating and switching sequence as described in detail with reference to FIG. 3.

Bit lines 42 are coupled to a known column addressing unit 46 for coupling one of bit lines 42 (on the basis of address and control signals supplied by control logic circuit 48) to the inverting input of operational amplifier 6, in turn coupled to current source 7. As in FIGS. 1 and 2, current source 7 is also coupled to reference line 13 at voltage $V_2$, and the noninverting input of operational amplifier 6 is at voltage $V_r$.

The output 11 of operational amplifier 6 is coupled to a known row addressing unit 47 for coupling output 11 to a predetermined word line 40 (on the basis of address and control signals supplied by control logic circuit 48).

Each time, control logic circuit 48 therefore couples a predetermined cell 1, located at the junction of the addressed word line 40 and bit line 42, to output 11 and the inverting input of operational amplifier 6 to obtain circuit 20 (FIG. 2) for the cell 1 in question, which may therefore be read and programmed as described previously.

This therefore solves the slow reading problems mentioned above, by source node 43, during reading, being coupled to a zero-impedance voltage source (line 3), so that the transients created by its high capacitive load are not longer than those already present for other reasons.

In the circuit shown in FIG. 5, the capacitance of the drain terminal acquires added importance (because this is now coupled to the virtual ground of operational amplifier 6) but is much lower than the source capacitance by virtue of each column in the array having its own bit line and its own metal line separated from the other bit and metal lines.

The user, by selecting the operation steps to be carried out by the control logic 28, may select either a fast program mode which provides a digital output check signal or a more precise program mode having an analog output check signal, but which may be slightly slower than the digital output check signal mode.

The embodiments of the check circuit described provide for automatic multilevel programming (e.g., up to 128 different levels per cell) of large-size memory arrays (with as many as a million cells or more). The circuit provides for complete, extremely fast programming of the cells (e.g., 1 ms/cell in the case of a closed-loop configuration for a 1 megabit array with 5-bit storage per cell). The circuits shown may be fully or partly integrated in complex chips, may be used for different programming algorithms, and provide fast, automatic digital-address programming using a selection circuit (in the open-loop configuration).

The check circuit described is therefore particularly suitable for use in multilevel analog or digital associative memories, e.g., for character recognition, and may also be used to advantage for weight storage in A/D and D/A converters, and for offset storage in circuits for correcting the offset of operational amplifiers.

Clearly, changes may be made to the method and circuit as described and illustrated herein without, however, departing from the scope of the present invention. In particular, in the circuit, the noninverting terminal of amplifier 6 may be biased at any constant voltage, just as the bias value of the drain terminal of the cell may be selected appropriately. The programming procedure may differ as compared with that described, as may the programming circuit, which do not form part of the invention.

We claim:

1. A method of checking multilevel programming of a nonvolatile memory cell comprising a first and a second terminal, a gate terminal and a floating-gate region, said floating-gate region storing electric charge determining an actual threshold value stored in said cell, said method comprising steps of:

biasing said first terminal of said cell at a constant voltage;

biasing said gate terminal of said cell at a check voltage;

supplying a predetermined current to said cell to determine a voltage drop, between said gate terminal and said second terminal, related to said actual threshold value; and supplying a voltage present at said second terminal to an input of an operational amplifier.

2. A method as claimed in claim 1 wherein:

said step of biasing said gate terminal comprises a step of biasing said gate terminal at a desired threshold value; and said step of supplying said voltage comprises a step of determining whether said voltage drop is greater or less than said desired threshold value.

3. A method as claimed in claim 2 wherein said determining step comprises a step of comparing said voltage at said second terminal with a first predetermined reference voltage.

4. A method as claimed in claim 1 wherein:

said step of biasing said gate terminal comprises a step of coupling an output of said operational amplifier to said gate terminal; and said step of supplying said voltage comprises steps of:
coupling said second terminal of said cell to an inverting input of said operational amplifier; and
coupling a noninverting input of said operational amplifier to a second reference voltage.

5. A method as claimed in claim 1 wherein:

said step of biasing said first terminal comprises a step of biasing a drain terminal; and said step of supplying a voltage from said second terminal comprises a step of supplying a voltage from a source terminal.

6. A method as claimed in claim 1 wherein:

said step of biasing said first terminal comprises a step of biasing a source terminal; and said step of supplying a voltage from said second terminal comprises a step of supplying a voltage from a drain terminal.

7. A circuit for checking multilevel programming, said circuit comprising:

a nonvolatile memory cell including:
a first and a second terminal;
a gate terminal; and
a floating-gate region, wherein said floating-gate region stores electric charge determining an actual threshold value stored in said cell;

a first constant-voltage node coupled to said first terminal of said cell;

a check-voltage node coupled to said gate terminal of said cell;

a constant current source coupled to said second terminal of said cell and determining, between said gate terminal and said second terminal, a voltage drop ($V_{gs}$) related to said actual threshold value; and an operational amplifier having a first input coupled to said second terminal of said cell, and a second input coupled to a second constant-voltage node.

8. A circuit as claimed in claim 7 wherein:

said check-voltage node is biased at a voltage equal to a desired threshold value; and said operational amplifier supplies a signal indicating said actual threshold value exceeds said desired threshold value.

9. A circuit as claimed in claim 7 wherein said check-voltage node is coupled to an output terminal of said operational amplifier supplying a signal related to said actual threshold value.

10. A circuit as claimed in claim 7 wherein said cell is a flash-EEPROM cell.

11. A circuit as claimed in claim 7 wherein said second input of said operational amplifier is grounded.

12. A circuit as claimed in claim 7 wherein said constant current source includes:

a first terminal coupled to said second terminal of said cell; and a second terminal coupled to a third constant-voltage node at a negative potential with respect to said second constant-voltage node.

13. A circuit as claimed in claim 7 wherein:

said first terminal is a drain terminal; and said second terminal is a source terminal.

14. A circuit as claimed in claim 7 wherein:

said first terminal is a source terminal; and said second terminal is a drain terminal.

15. A circuit as claimed in claim 7, further including:

first switching means for selectively coupling said first terminal to said first constant-voltage node or to a first programming-voltage node;

second switching means for selectively coupling said gate terminal to said check-voltage node or to a second programming-voltage node;

third switching means for selectively coupling said second terminal to said first input of said operational amplifier or to a reference potential line; and a control logic circuit generating control signals for said first, second and third switching means.

16. A method for multilevel programming of a nonvolatile memory cell comprising a first and a second terminal, a gate terminal and a floating-gate region, said floating-gate region storing electric charge determining an actual threshold value stored in said cell, said method comprising a step of reading a value programmed into said cell, said reading step comprising steps of:

biasing said first terminal of said cell at a constant voltage;

supplying a predetermined current to said cell to determine a voltage drop, between said gate terminal and said second terminal, related to said actual threshold value;

supplying a voltage present at said second terminal to an input of an operational amplifier; and coupling a voltage present at an output of said operational amplifier to said gate terminal.

17. A method as claimed in claim 16, further comprising a step of writing to said cell, said writing step comprising steps of:

comparing a voltage at said output of said operational amplifier to a check voltage to determine when said voltage at said output is greater than said check voltage;

ending said writing step for said cell when said voltage at said output is greater than said check voltage, and when said voltage at said output is less than said check voltage, including steps of:

decoupling said first terminal from said constant voltage, said second terminal from said predetermined current and said gate terminal from said output of said operational amplifier;

supplying first programming pulses to said gate terminal for a predetermined period of time;

supplying second programming pulses to said first terminal for said predetermined period of time;

supplying a reference voltage to said second terminal for said predetermined period of time;

ceasing said supplying first and second programming pulses and said reference voltage steps and initiating said reading step at a conclusion of said predetermined period of time.

* * * * *